United States Patent
Yasugi et al.

(10) Patent No.: US 8,801,305 B2
(45) Date of Patent: Aug. 12, 2014

(54) EXPOSURE CONTROL DEVICE

(71) Applicant: Panasonic Corporation, Osaka (JP)

(72) Inventors: Shunsuke Yasugi, Osaka (JP); Kozo Ezawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/111,366

(22) PCT Filed: Dec. 5, 2012

(86) PCT No.: PCT/JP2012/007806
§ 371 (c)(1),
(2), (4) Date: Oct. 11, 2013

(87) PCT Pub. No.: WO2013/084489
PCT Pub. Date: Jun. 13, 2013

(65) Prior Publication Data
US 2014/0028991 A1    Jan. 30, 2014

(30) Foreign Application Priority Data
Dec. 8, 2011 (JP) .................................. 2011-268853

(51) Int. Cl.
*G03B 9/02* (2006.01)

(52) U.S. Cl.
USPC .......................................................... 396/505

(58) Field of Classification Search
USPC ......................... 396/505; 359/490.01, 490.02
See application file for complete search history.

(56) References Cited

U.S. PATENT DOCUMENTS

| | | | | |
|---|---|---|---|---|
| 2,269,713 A * | 1/1942 | Erwin | ............................ | 352/214 |
| 2,450,761 A * | 10/1948 | MacNeille | ..................... | 356/124 |
| 3,501,229 A * | 3/1970 | Dejoux | ........................ | 352/91 R |
| 4,592,632 A * | 6/1986 | Renold | .......................... | 352/214 |
| 5,481,321 A * | 1/1996 | Lipton | ............................ | 352/57 |
| 5,673,103 A * | 9/1997 | Inoue et al. | ..................... | 355/71 |
| 5,805,243 A * | 9/1998 | Hatano et al. | .................... | 349/5 |
| 5,828,500 A | 10/1998 | Kida et al. | | |
| 6,726,333 B2 * | 4/2004 | Huibers et al. | .................. | 353/84 |
| 6,874,889 B1 * | 4/2005 | Hill | ................................. | 352/208 |
| 8,172,399 B2 * | 5/2012 | Decusatis et al. | ................. | 353/8 |

(Continued)

FOREIGN PATENT DOCUMENTS

JP    62-000178 A    1/1987
JP    04-212117 A    8/1992

(Continued)

OTHER PUBLICATIONS

PCT/ISA/210 for International Application No. PCT/JP2012/007806, mailed Mar. 12, 2013.

(Continued)

*Primary Examiner* — Rodney Fuller
(74) *Attorney, Agent, or Firm* — Renner, Otto, Boisselle & Sklar, LLP

(57) ABSTRACT

An exposure controller according to the present disclosure is to be arranged on an optical path, and includes first and second light quantity regulators, each of which has a first region that has a property of transmitting a light beam polarized in a particular direction and a second region that does not have the property of transmitting a light beam polarized in the particular direction. The exposure controller regulates the quantity of light by rotating the first and second light quantity regulators.

19 Claims, 12 Drawing Sheets

(56) References Cited

U.S. PATENT DOCUMENTS

| | | | |
|---|---|---|---|
| 8,358,369 B2 * | 1/2013 | Amano | 348/368 |
| 2005/0140820 A1 | 6/2005 | Takeuchi et al. | |
| 2007/0139519 A1 * | 6/2007 | DeCusatis et al. | 348/58 |
| 2007/0139619 A1 * | 6/2007 | DeCusatis et al. | 353/7 |
| 2012/0062845 A1 * | 3/2012 | Davis et al. | 352/45 |

FOREIGN PATENT DOCUMENTS

| | | |
|---|---|---|
| JP | 05-323264 A | 12/1993 |
| JP | 09-166518 A | 6/1997 |
| JP | 2001-061165 A | 3/2001 |
| JP | 2006-337658 A | 12/2006 |
| JP | 2008-096461 A | 4/2008 |
| JP | 2010-085772 A | 4/2010 |

OTHER PUBLICATIONS

PCT/ISA/237 (partial English translation and abstract) for International Application No. PCT/JP2012/007806, dated Mar. 12, 2013.
International Preliminary Report on Patentability (Form PCT/IPEA/409) for corresponding International Application No. PCT/JP2012/007806 dated Nov. 12, 2013 and partial English translation.

* cited by examiner (a)

1001
1002

(b)

1003

EXPOSURE CONTROL DEVICE

TECHNICAL FIELD

The present application relates to an exposure controller which regulates the quantity of light to transmit.

BACKGROUND ART

In a conventional image capture device such as a camera, the quantity of light to be transmitted through an optical system and incident on an image sensor is generally adjusted with an optical diaphragm or a shutter.

However, to reduce the quantity of light with an optical diaphragm, the aperture size of the optical diaphragm needs to be decreased, and therefore, a diffraction phenomenon of the light will cause a decrease in resolution, which is a problem. In addition, the aperture size of the optical diaphragm also affects the depth of field, and the shutter speed affects how the subject gets blurred if either the subject or the image capture device itself is moving. That is why according to an exposure control method that uses the optical diaphragm or the shutter speed, the resultant depth of field or way of subject's motion blur may become an unintentional one, which is also a problem.

To overcome these problems, according to a known method, the quantity of light is regulated by rotating two polarizers, which are arranged coaxially, relative to each other on their axes. According to such a method, since at least one polarizer is always present on the optical path and since some polarization components are always cut, the maximum quantity of light transmitted decreases compared to a situation where no polarizers are provided at all.

Thus, Patent Document No. 1 discloses an exposure controller which includes two polarizers and two driving sources, which regulates the quantity of light by getting the two polarizers rotated relative to each other by one of the two driving sources, and which retracts the two polarizers from the optical path using the other driving source.

On the other hand, Patent Document No. 2 discloses an exposure controller which includes two polarizers and one driving source and which not only regulates the quantity of light by getting the two polarizers rotated relative to each other, but also retracts the two polarizers from the optical path, by using the same driving source. FIG. 14 illustrates a conventional exposure controller 1000 as disclosed in Patent Document No. 2. Specifically, FIG. 14(a) illustrates a situation where the two polarizers are inserted into the optical path, while FIG. 14(b) illustrates a situation where the two polarizers are retracted from the optical path. In the conventional exposure controller 1000, the two polarizers 1001 and 1002 are fixed on a polarizer driving plate 1003 and the polarizer driving plate 1003 is moved when the polarizers 1001 and 1002 need to be retracted.

According to any of these configurations, a state where no polarizers are present on the optical path can be created, and therefore, the maximum value of the adjustable transmittance can be increased.

CITATION LIST

Patent Literature

Patent Document No. 1: Japanese Laid-Open Patent Publication No. 2010-85772

Patent Document No. 2: Japanese Laid-Open Patent Publication No. 2006-337658

SUMMARY OF INVENTION

Technical Problem

According to the conventional technology described above, however, a driving source of a relatively large size needs to be used to retract the polarizers from the optical path, and therefore, the overall size of the exposure controller may be too large in some cases.

A non-limiting exemplary embodiment of the present application provides an exposure controller which can regulate the quantity of light to transmit using a simple configuration.

Solution to Problem

An exposure controller according to an aspect of the present invention is supposed to be arranged on an optical path and includes first and second light quantity regulators, each of which has a first region that has a property of transmitting a light beam polarized in a particular direction and a second region that does not have the property of transmitting a light beam polarized in the particular direction. The exposure controller regulates the quantity of light by rotating the first and second light quantity regulators.

Advantageous Effects of Invention

An exposure controller according to an aspect of the present invention can create a state where there is no polarization region at all on the optical path, even though the controller has a simple configuration and needs to perform just a simplified control. As a result, the quantity of light can be regulated even without decreasing the maximum quantity of light transmitted. In addition, since those light quantity regulators can be slid by members with a small diameter, the light quantity regulators can be rotated with little friction and the energy to consume to rotate the polarizers and the wear of the members can be both reduced.

DESCRIPTION OF EMBODIMENTS

Figure 1A:
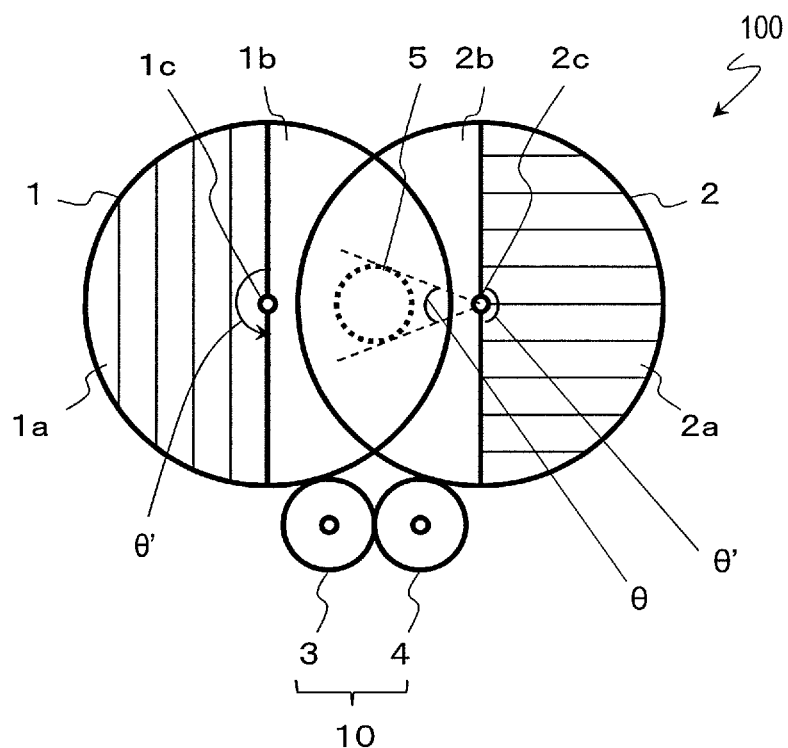
FIG. 1A A top view illustrating a configuration for a first embodiment of an exposure controller according to the present invention.

The present inventors checked out the exposure controllers disclosed in Patent Documents Nos. 1 and 2 to find that those controllers need to have a shaft with a large diameter, because each of those patent documents uses a circular polarizer which needs to have a gear on its outer periphery to rotate. For that reason, a large torque is required to rotate and move such polarizer(s). In addition, since the shaft has a large diameter, the friction on the outer periphery of the polarizer increases. And due to such friction, the torque and energy required to rotate the polarizer further increase. On top of that, such friction will cause a wear of the members. Furthermore, even when the polarizer(s) need(s) to be retracted, the torque required and the friction both increase, too.

Such problems may become particularly serious for an image capture device of a small size which needs an exposure controller separately from an optical diaphragm or a shutter, among other things. Thus, to overcome such problems, the present inventors invented a novel exposure controller. An aspect of the present invention is outlined as follows:

An exposure controller according to an aspect of the present invention is to be arranged on an optical path, and includes first and second light quantity regulators, each of which has a first region that has a property of transmitting a light beam polarized in a particular direction and a second region that does not have the property of transmitting a light beam polarized in the particular direction. The exposure controller regulates the quantity of light by rotating the first and second light quantity regulators.

Each of the first and second light quantity regulators may have an axis of rotation at their center. The axes of rotation may be arranged outside of the optical path. The first and second light quantity regulators may partially overlap with each other on the optical path. And the quantity of light may be regulated by having the first and second light quantity regulators rotate on their axis of rotation.

The respective axes of rotation of the first and second light quantity regulators may be arranged at mutually different positions.

If the first and second light quantity regulators have rotated so that the respective first regions of the first and second light quantity regulators overlap with the optical path and that those particular directions in the respective first regions of the first and second light quantity regulators are perpendicular to each other, the transmittance of light through the first and second light quantity regulators may become minimum.

If the first and second light quantity regulators have rotated so that the respective second regions of the first and second light quantity regulators overlap with the optical path, the transmittance of light through the first and second light quantity regulators may become maximum.

While the respective first regions of the first and second light quantity regulators are overlapping with the optical path, those particular directions in the respective first regions of the first and second light quantity regulators which have been perpendicular to each other may become parallel to each other.

The first and second light quantity regulators may rotate in mutually opposite directions at the same velocity.

The first and second light quantity regulators may rotate in mutually opposite directions at respectively different velocities.

The first and second light quantity regulators may rotate in the same direction at respectively different velocities.

The respective axes of rotation of the first and second light quantity regulators may be aligned with each other.

While those particular directions in the respective first regions of the first and second light quantity regulators are parallel to each other, the first and second light quantity regulators may rotate in the same direction at the same velocity.

While the respective second regions of the first and second light quantity regulators are overlapping with the optical path and while those particular directions in the respective first regions of the first and second light quantity regulators are not parallel to each other, one of the first and second light quantity regulators may be rotating but the other may be standing still.

The exposure controller may further include an optical element which transforms incoming light into a circularly polarized light beam. The light that has been transmitted through the optical element may be transmitted through the first and second light quantity regulators.

The exposure controller may further include an optical element which is arranged so that light that has been transmitted through the first and second light quantity regulators is incident on the optical element and which transforms the incident light into a circularly polarized light beam.

The exposure controller may further include an optical diaphragm or shutter to be arranged on the optical path of the optical system.

Hereinafter, embodiments of an exposure controller and image capture device according to the present invention will be described with reference to the accompanying drawings. It should be noted that each of the various embodiments to be described below is just a specific example of the present invention. And the elements, the arrangement and connection of the elements, and the order of operations to be shown in the following description of embodiments are only exemplary ones, too. It is intended that the scope of the present invention is defined only by the appended claims.

Embodiment 1

FIG. 1A illustrates a configuration for a first embodiment of an exposure controller according to the present invention.

The exposure controller 100 shown in FIG. 1A includes a light quantity regulator 1, another light quantity regulator 2, and gears 3 and 4.

Each of these two light quantity regulators (i.e., first and second light quantity regulators) 1 and 2 has a polarizing region 1a, 2a that has a property of transmitting a light beam vibrating in a particular direction and a non-polarizing region 1b, 2b that does not have such a property of transmitting a light beam vibrating in the particular direction. Also, the light quantity regulators 1 and 2 have axes of rotation 1c and 2c, respectively. These axes of rotation 1c and 2c are located inside of the light quantity regulators 1 and 2 and outside of the optical path 5.

These light quantity regulators 1 and 2 partially overlap with each other on the optical path and cross the optical path 5 entirely.

Also, in this embodiment, the polarizing region 1a and non-polarizing region 1b of the light quantity regulator 1 each have been defined to have a fan shape with respect to the axis of rotation 1c as its center, and the center angle θ' of the polarizing region 1a is 180 degrees. Thus, the center angle θ' of the non-polarizing region 1b is also 180 degrees. The polarizing region 2a and non-polarizing region 2b of the other light quantity regulator 2 also have the same structure. However, as long as the polarizing regions 1a and 2a are arranged so as to cover the optical path 5 entirely, the arrangement shown in FIG. 1A does not have to be adopted but the polarizing regions 1a and 2a may be arranged not in the vicinity of the axes of rotation 1c and 2c.

For example, the optical path 5 may intersect with the light quantity regulators 1 and 2 at right angles, and the plan view illustrated in FIG. 1A is parallel to the light quantity regulators 1 and 2. However, the optical path 5 just needs to intersect with these light quantity regulators 1 and 2, and may be oblique to the light quantity regulators 1 and 2. Furthermore, the optical path 5 does not have to have a circular cross section as shown in FIG. 1 but may also have any of various other cross-sectional shapes.

The polarizing regions 1a and 2a may be formed of a polarization film, for example. The polarization film may be made of polyvinyl alcohol or iodine or may also be an arrangement of metallic wires of aluminum, for example. However, as long as the polarization film has a property of transmitting a light beam polarized in a particular direction, its material is not particularly limited. And a polarization film made of any of various materials including organic and inorganic substances may be adopted. Also, a polarization film does not have to be used but the polarizing regions 1a and 2a may also be polarizers with any other shape such as plate-like polarizers.

The non-polarizing regions 1b and 2b do not have the property of transmitting a light beam polarized in a particular direction. Specifically, no polarizers such as the polarization film described above are provided for the non-polarizing regions 1b and 2b, and therefore, the non-polarizing regions 1b and 2b just transmit incoming light without polarizing it. In the light quantity regulators 1 and 2 shown in FIG. 1A and other drawings that follow it, the polarizing regions 1a and 2a are indicated by stripes (or hatching) and the direction in which the stripes run indicates the direction in which the transmitted light vibrates. In the following description, the axis that is parallel to the vibration direction of the light transmitted through the polarizing regions 1a and 2a will be referred to herein as an "axis of transmission".

Figure 1B:
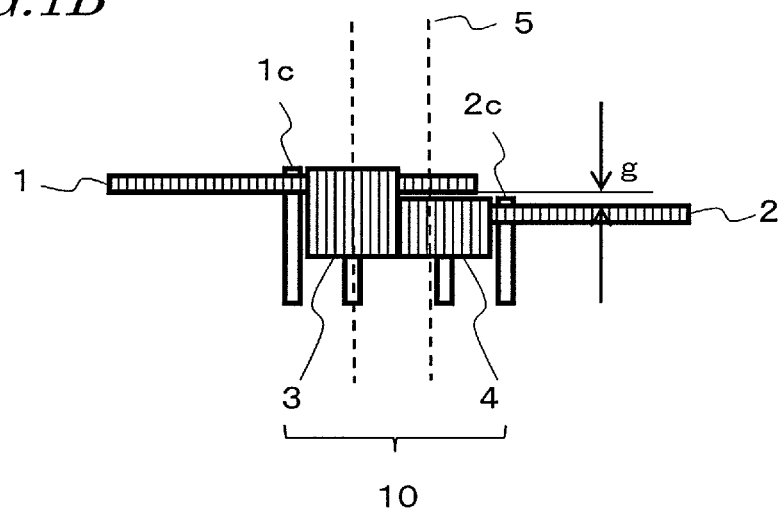
FIG. 1B A side view of the exposure controller of the first embodiment.

FIG. 1B is a side view of the exposure controller 100 shown in FIG. 1A. Each of the light quantity regulators 1 and 2 has gear teeth on their side surface. The gear 3 rotates with the power supplied by a motor (or actuator) that is a driving source (not shown). The gear 3 may be connected to a rotating disc or any other member, which may be turned manually by the operator with his or her finger. As the gear 3 rotates, the light quantity regulator 1 and the other gear 4 which are engaged with the gear 3 also rotate. And as the gear 4 rotates, the other light quantity regulator 2 which is engaged with the gear 4 also rotates. According to such a configuration, the gears 3 and 4 together form a drive mechanism 10 that makes the light quantity regulators 1 and 2 rotate either in the same direction or in two opposite directions. In this embodiment, the drive mechanism 10 makes the light quantity regulators 1 and 2 rotate in mutually opposite directions at the same number of revolutions.

As shown in FIG. 1B, the light quantity regulators 1 and 2 are arranged so as to be roughly parallel to each other. However, as long as the light quantity regulators 1 and 2 cross the optical path 5 entirely, the light quantity regulators 1 and 2 do not have to be exactly parallel to each other but may form an angle of at most several ten degrees between them or may leave a gap g between them. Nevertheless, if the light quantity regulators 1 and 2 formed too large an angle between them or if the gap g became too wide, there would be increased chances of producing stray light (not shown in FIG. 1B) to be transmitted through only one of these two light quantity regulators 1 and 2 without being transmitted through the other. Should such stray light pose a problem, any appropriate shielding structure could be provided to prevent the stray light from being incident on the light quantity regulator 2, for example, through the gap g.

In this embodiment, the light quantity regulators 1 and 2 rotate at the same velocity. Also, unless otherwise stated, the light passing through the optical path 5 to be incident on this exposure controller 100 is supposed to include linearly polarized light components in every direction uniformly. Furthermore, no matter whether the incoming light passes through the polarizing regions 1a and 2a of the exposure controller 100 or the non-polarizing regions 1b and 2b thereof, the light will be regarded herein as being "transmitted" through those regions.

Hereinafter, it will be described with reference to FIG. 2 how this exposure controller 100 operates. As described above, in this embodiment, the center angle θ' of the polarizing regions 1a and 2a of the light quantity regulators 1 and 2 is 180 degrees, and therefore, both the boundary between the polarizing and non-polarizing regions 1a and 1b and the boundary between the polarizing and non-polarizing regions 2a and 2b are linear ones. Hereinafter, the operation will be described on the supposition that the gear 3 starts to be rotated in the direction indicated by the arrow R in an initial state where the respective polarizing regions 1a and 2a of the light quantity regulators 1 and 2 cover the optical path 5 entirely and where the respective axes of transmission of the polarizing regions 1a and 2a intersect with each other at right angles. The incoming light is incident on the light quantity regulator 1 and the light transmitted through the light quantity regulator 1 is transmitted through the light quantity regulator 2 next.

FIG. 2(a) illustrates the initial state. FIG. 2(b) illustrates a state where the light quantity regulators 1 and 2 have rotated 15 degrees from their initial positions in the opposite direction from the one indicated by the arrow R and in the same direction as the one indicated by the arrow R, respectively. FIG. 2(c) illustrates a state where the light quantity regulators 1 and 2 have rotated 30 degrees in those directions. FIG. 2(d) illustrates a state where their angle of rotation has reached 45 degrees. And FIG. 2(e) illustrates a state where their angle of rotation has reached 120 degrees. Meanwhile, FIG. 3 shows how the transmittance of the exposure controller 100 changes with the angle of rotation of the light quantity regulators 1 and 2 from their initial state. It should be noted that the relation between the angle of rotation and the transmittance is shown in FIG. 3 just schematically and not exactly, and therefore, is not intended to limit the scope of the present invention. In FIG. 3, the reference signs (a), (b), (c) and (d) indicate that the angles of rotation of the light quantity regulators 1 and 2 are as shown in FIGS. 2(a), 2(b), 2(c) and 2(d), respectively.

As shown in FIG. 2(a), in the initial state, the axes of transmission of the respective polarizing regions 1a and 2a of the light quantity regulators 1 and 2 intersect with each other at right angles, and therefore, the transmittance of this exposure controller 100 becomes the smallest. That is to say, in such a state, the transmittance is lower than 50%. Ideally, all of the light that has been transmitted through the polarizing region 1a of the light quantity regulator 1 is cut by the polarizing region 2a of the light quantity regulator 2. In that case, the transmittance may become 0%, for example. In this description, the "transmittance" refers herein to the ratio of the quantity of light that has been transmitted through this exposure controller 100 to the total quantity of light passing through the optical path 5. If the transmittance is 100%, the light is not polarized and transmitted through the exposure controller 100 without being cut at all. On the other hand, if the transmittance is 0%, the light passing through the optical path 5 is cut completely by the exposure controller 100.

As shown in FIGS. 2(a) to 2(d), as the gear 3 rotates, the light quantity regulators 1 and 2 also rotate and respective axes of transmission of the polarizing regions 1a and 2a no longer intersect with each other at right angles. As a result, the light transmitted through the polarizing region 1a of the light quantity regulator 1 comes to have some components that are parallel to the axis of transmission of the polarizing region 2a of the light quantity regulator 2. Consequently, part of the light transmitted through the polarizing region 1a of the light quantity regulator 1 is transmitted through the polarizing region 2a of the light quantity regulator 2. The further the light quantity regulators 1 and 2 rotate, the smaller the angle formed by the respective axes of transmission of the polarizing regions 1a and 2a becomes. As a result, the quantity of light transmitted through the polarizing region 2a of the light quantity regulator 2 increases.

As the transmittance of this exposure controller 100 increases, the axes of transmission of the respective polarizing regions 1a and 2a of the light quantity regulators 1 and 2 soon become parallel to each other (i.e., form an angle of zero degrees between them) as shown in FIG. 2(d), when the transmittance becomes maximum while the respective polarizing regions 1a and 2a of the light quantity regulators 1 and 2 are present on the optical path 5. In such a situation, the transmittance may be approximately 50%, for example.

If the light quantity regulators 1 and 2 are further rotated from their positions shown in FIG. 2(d) by rotating the gear 3, the axes of transmission of the respective polarizing regions 1a and 2a of the light quantity regulators 1 and 2 come to form an angle other than zero degrees again. As a result, the transmittance decreases as shown in FIG. 3.

As the gear 3 is further rotated, the respective non-polarizing regions 1b and 2b of the light quantity regulators 1 and 2 start to overlap with the optical path 5. The light transmitted through the non-polarizing region 1b is not polarized. That is why as the area of overlap between the non-polarizing regions 1b and 2b and the optical path 5 increases, the transmittance rises as shown in FIG. 3.

And when the state shown in FIG. 2(e) is reached, all of the incoming light is incident on the non-polarizing regions 1b and 2b and is transmitted completely without being cut. That is to say, this is a state in which there are no polarizing regions at all on the optical path 5. In such a situation, the transmittance may be approximately 100%, for example.

If the gear 3 is rotated from the position shown in FIG. 2(e) in the direction opposite from the one indicated by the arrow R, then the states and transmittances can be changed sequentially in reverse order from the ones shown in FIG. 2(e) to the initial state shown in FIG. 2(a).

According to this embodiment, the friction between the polarizers and other members can be reduced, and a state where there are no polarizers at all on the optical path can be created, by using a simple structure. As a result, an exposure controller which can change the transmittance precisely in a broad range is realized.

Specifically, since each of the two light quantity regulators has a polarizing region and a non-polarizing region and rotates according to this embodiment, a state where the two non-polarizing regions overlap with the optical path, a state where the two polarizing regions overlap with the optical path, and an intermediate state can be created. In addition, in the state where the two polarizing regions overlap with the optical path, the angle defined by the respective axes of transmission of those two polarizing regions can be changed. According to the conventional method of regulating the quantity of polarized light with two polarizers arranged on the optical path, the transmittance can be adjusted only within the range of approximately 0% to approximately 50%. On the other hand, according to this embodiment, the transmittance can be regulated within the range of approximately 0% through approximately 100%.

Figure 14:
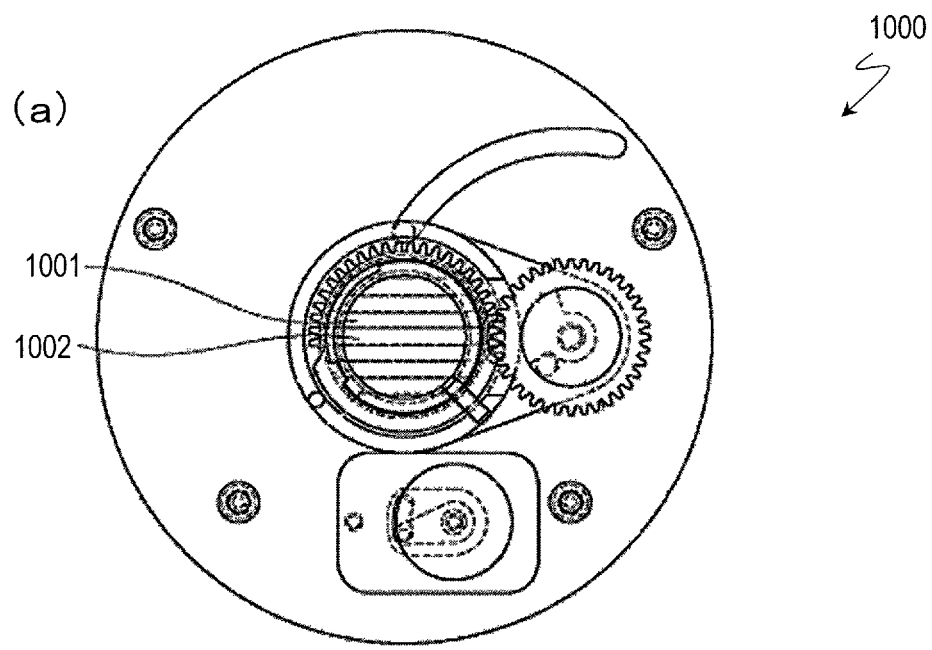
FIGS. 14 (a) and (b) illustrate a configuration for a conventional exposure controller.
Figure 14:
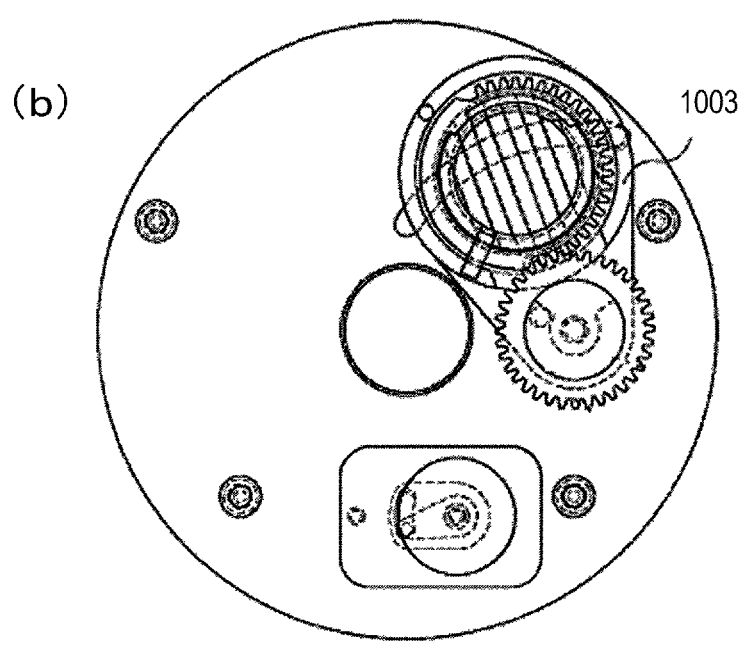

Also, in the conventional exposure controller 1000 shown in FIG. 14, the radius of the axis of rotation of the two polarizers 1001 and 1002 is approximately as large as that of the polarizers 1001 and 1002, and therefore, significant friction is caused between the polarizer driving plate 1003 and the polarizers 1001, 1002. According to this embodiment, however, there is no need to perform the operation of retracting the light quantity regulators 1 and 2 themselves. That is why the axes of rotation 1c and 2c can be arranged at respective centers of the light quantity regulators 1 and 2, and the radius of the axes of rotation can be smaller than in the conventional exposure controller 1000. As a result, the area of contact between the axis of rotation of the light quantity regulators 1 and 2 and other members decreases and the light quantity regulators 1 and 2 can be rotated with less friction. Consequently, less energy and a driving source of a smaller size are needed to rotate them.

Furthermore, according to this embodiment, there is no need to perform the operation of retracting the light quantity regulators 1 and 2 themselves, and therefore, no energy is wasted in vain.

Figure 2:
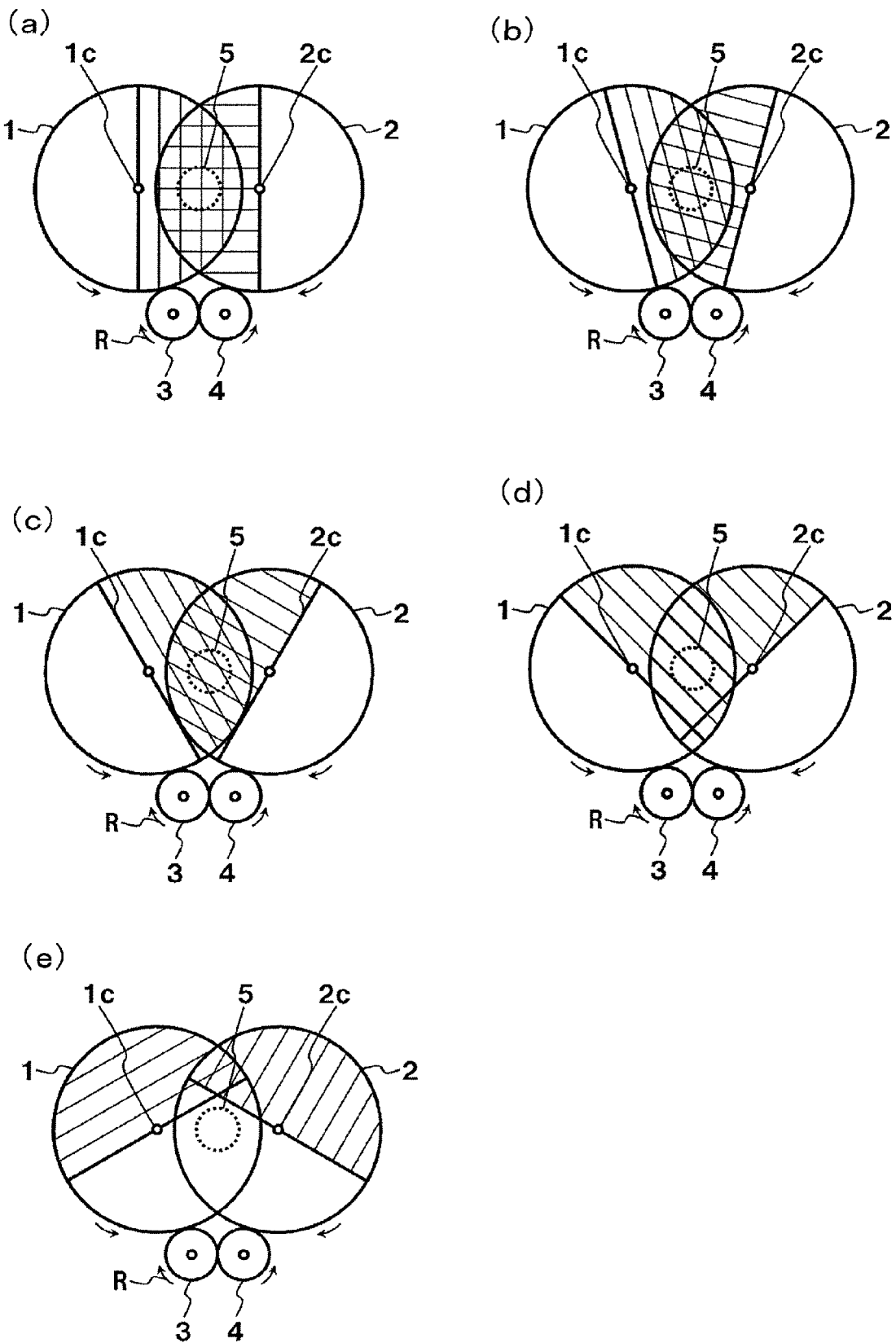
FIG. 2 (a) to (e) illustrate a series of states where light quantity regulators are rotated to respective degrees in the exposure controller of the first embodiment.
Figure 3:
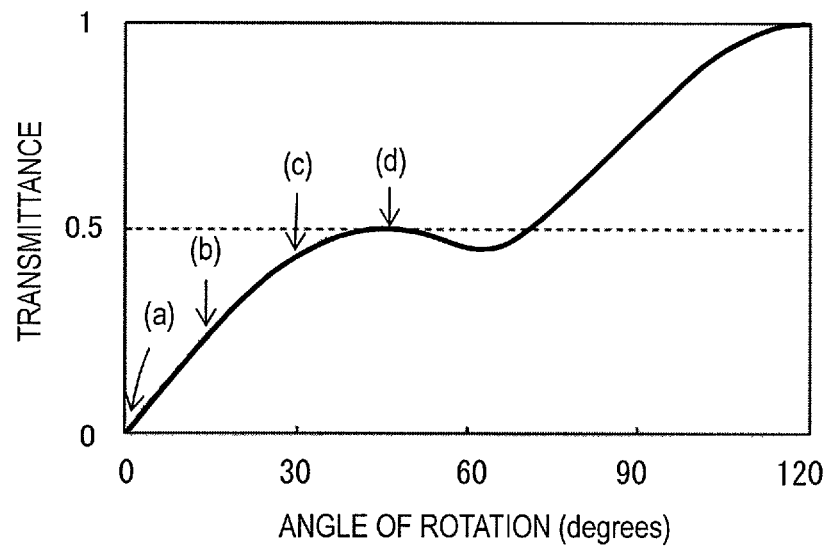
FIG. 3 A graph showing how the transmittance of the exposure controller of the first embodiment changes with the angle of rotation of its light quantity regulators.
Figure 4:
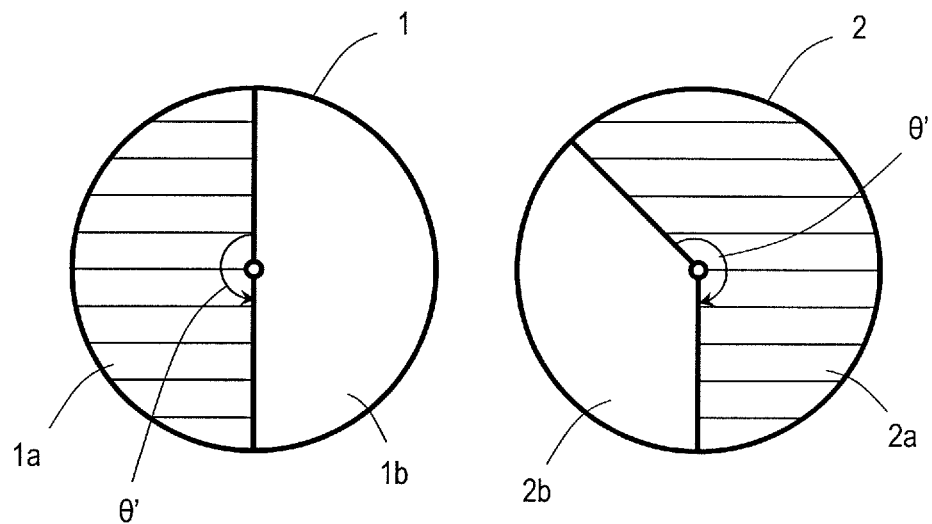
FIG. 4 Illustrates another exemplary pair of light quantity regulators according to the first embodiment.

In the exposure controller 100 of the embodiment described above, the polarizing regions 1a, 2a and the non-polarizing regions 1b, 2b all have a semicircular shape, of which the radius is about twice as large as the diameter of the optical path 5, as shown in FIGS. 1A and 2. However, this is just an example of the present invention and that shape does not have to be used. As long as each of the light quantity regulators 1 and 2 has a polarizing region 1a, 2a and a non-polarizing region 1b, 2b and as long as either the polarizing regions 1a and 2a or the non-polarizing regions 1b and 2b can be arranged to cover the optical path 5 by rotating the light quantity regulators 1 and 2 around their axis of rotation, the transmittance of the exposure controller can be changed. That is why the sizes and shapes of the polarizing regions 1a, 2a and the non-polarizing regions 1b, 2b may be changed arbitrarily and either the polarizing regions 1a and 2a or the non-polarizing regions 1b and 2b may have mutually different shapes or sizes. For example, the center angles θ' of the respective polarizing regions 1a and 2a of the light quantity regulators 1 and 2 may be different from each other as shown in FIG. 4. In that case, the center angles of the respective non-polarizing regions 1b and 2b of the light quantity regulators 1 and 2 are also different from each other.

Also, if the following two conditions are satisfied, the transmittance of the exposure controller can be changed more precisely:

1. The respective polarizing regions 1a and 2a of the light quantity regulators 1 and 2 have such a size and shape to entirely cover the traces of the optical path 5 on the light quantity regulators 1 and 2 while the axes of transmission of the respective polarizing regions 1a and 2a of the light quantity regulators 1 and 2 which were parallel to each other initially turn perpendicular to each other as the light quantity regulators 1 and 2 rotate; and
2. The non-polarizing regions 1b and 2b have such a size and shape to entirely cover the optical path 5.

In the following description, these two conditions on the sizes and shapes of the polarizing regions 1a, 2a and the non-polarizing regions 1b, 2b will be referred to herein as "Condition A".

This embodiment can be modified in various manners. For example, the exposure controller of this embodiment may have the structure shown in FIG. 5. Just like the exposure controller 100, this exposure controller 101 also includes light quantity regulators 1 and 2 and gears 3 and 4. The radius of the light quantity regulators 1 and 2 (i.e., the radius of the polarizing regions 1a, 2a and the non-polarizing regions 1b, 2b) is approximately as large as the diameter of the optical path 5. As a result, this exposure controller 101 can have a smaller size. Its features will be described below.

In this exposure controller 101, the respective regions of its light quantity regulators 1 and 2 are used so efficiently that the radius of the light quantity regulators 1 and 2 becomes approximately as large as the diameter of the optical path 5.

The light quantity regulators 1 and 2 of this exposure controller 101 have different $\theta$ and $\theta'$ from their counterparts of the exposure controller 100. In this modified example, $\theta$ is the angle formed between two tangents that can be drawn with respect to the smallest circle of which the center is located at the midpoint of the line segment that connects together the respective axes of rotation 1c and 2c of the light quantity regulators 1 and 2 and which can cover the optical path 5 entirely. On the other hand, $\theta'$ is the center angle of a fan shape formed by one of the polarizing regions 1a and 2a. The conditions to be satisfied by $\theta$ and $\theta'$ can be derived by making calculations.

First of all, the condition to be satisfied by $\theta$ will be described. In this embodiment, the light quantity regulators 1 and 2 are supposed to rotate in two opposite directions at the same velocity. That is why to change the states from the one where the axes of transmission of the respective polarizing regions 1a and 2a of the light quantity regulators 1 and 2 are perpendicular to each other into the one where those axes are parallel to each other, or vice versa, by rotating the light quantity regulators 1 and 2, the light quantity regulators 1 and 2 each need to rotate 45 degrees. Since the polarizing regions 1a and 2a always need to cover the optical path 5 entirely while the light quantity regulators 1 and 2 are rotating to 45 degrees, the polarizing regions 1a and 2a should cover the range of $\theta$+45 degrees in the circumferential direction of the light quantity regulators and 2. That is to say, the center angle $\theta'$ of the polarizing regions 1a and 2a needs to satisfy $\theta' = \theta + 45$.

In addition, to create a state where neither the polarizing region 1a nor the polarizing region 2a is present on the optical path 5, the non-polarizing regions 1b and 2b should cover the optical path 5 entirely. That is why the non-polarizing regions 1b and 2b also need to cover the range of $\theta$ degrees in the circumferential direction of the light quantity regulators 1 and 2. Since the sum of those required ranges just needs to be equal to or smaller than 360 degrees that defines one complete circumference, the relation defined by the following Inequality (1) can be derived:

$$(\theta+45)+\theta \leq 360 \tag{1}$$

By modifying this Inequality (1), the following Inequality (2) defining the condition to be satisfied by $\theta$ can be obtained:

$$\theta \leq 157.5 \tag{2}$$

The circumferential range to cover when the quantity of light transmitted through the exposure controller is changed from its minimum value to its maximum value is defined by the angle calculated by the left side of Inequality (1). In Inequalities (1) and (2), the larger the value of $\theta$, the more efficiently and the less wastefully the respective regions of the light quantity regulators 1 and 2 can be used. On the other hand, as the value of $\theta$ decreases, the regions that need not be used to regulate the exposure increase, so does the size of the light quantity regulators 1 and 2 themselves. In this case, the maximum value of the quantity of light refers herein to the maximum value of the quantity of light to be transmitted through the exposure controller in a situation where the non-polarizing regions 1b and 2b are present on the optical path 5 and no incoming light is cut at all.

Figure 5:
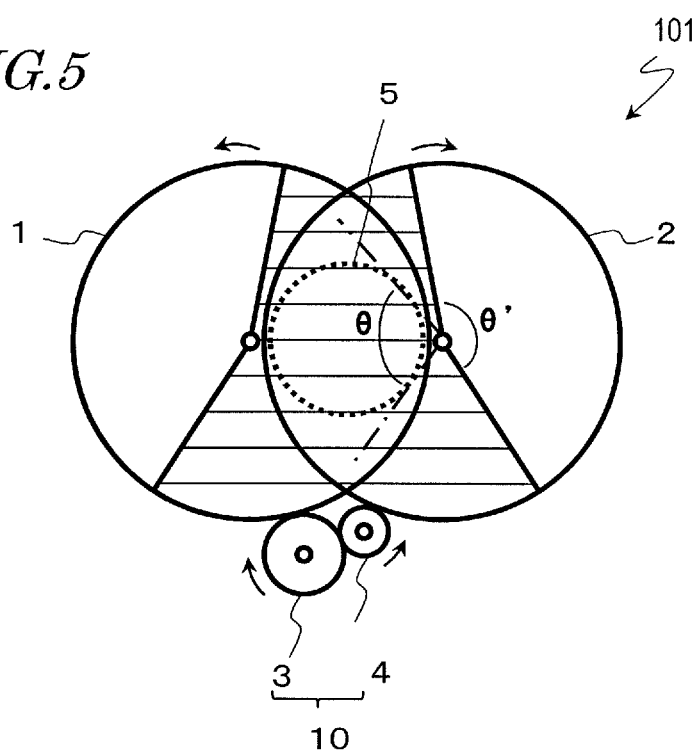
FIG. 5 Illustrates a modified example of the first embodiment.

According to Inequality (2), the maximum value of $\theta$ becomes 157.5 degrees. In FIG. 5, a portion corresponding to $\theta$ is illustrated to have that angle of 157.5 degrees.

Next, the condition to be satisfied by $\theta'$ shown in FIG. 1 will be described. $\theta'$ represents the center angle of the polarizing regions 1a and 2a as shown in FIG. 5. To meet Condition A described above, $\theta'$ needs to satisfy the relations defined by the following Inequalities (3) and (4):

$$\theta' \geq \theta + 45 \tag{3}$$

$$360 - \theta' \geq 157.5 \tag{4}$$

As long as these conditions are satisfied, the respective polarizing regions 1a and 2a of the light quantity regulators 1 and 2 of the exposure controller according to this embodiment may have any arbitrary shape. Even though the boundary between the polarizing and non-polarizing regions 1a and 1b and the boundary between the polarizing and non-polarizing regions 2a and 2b are both supposed to be linear in the exposure controller 100, those boundaries do not have to be linear ones as shown in FIG. 5 as long as Condition A and the conditions on $\theta$ and $\theta'$ are satisfied.

It should be noted that in the foregoing description, the radius of the axes of rotation 1c and 2c is not taken into consideration. However, if the radius of the axes of rotation 1c and 2c is non-negligible compared to the radius of the optical path 5, the radius of the light quantity regulators 1 and 2 may be determined with the radius of the axes of rotation 1c and 2c taken into account.

Also, although a single driving source is supposed to be used in the embodiment described above, the number of driving sources to use does not have to be one but may also be two or more. For example, each of the gears 3 and 4 may be driven by a single driving source.

Furthermore, the driving source does not have to be a motor. Alternatively, the user may rotate the light quantity regulators 1 and 2 and the gears 3 and 4 manually with his or her hand as described above.

Moreover, the midpoint of the line segment that connects the axes of rotation 1c and 2c together does not have to agree with the center of the circular optical path 5. As long as Condition A and the conditions on θ and θ' are satisfied, the axes of rotation 1c, 2c and the center of the optical path 5 may also be arranged at any positions other than the ones illustrated.

What is more, as long as Condition A and the conditions on θ and θ' are satisfied, the axes of rotation 1c and 2c may even be aligned with each other. If the axes of rotation are located at the same position, the light quantity regulators 1 and 2 overlap with each other and the overall size of the exposure controller can be reduced.

Furthermore, the non-polarizing regions 1b and 2b may be anything as long as those regions 1b and 2b do not have the property of transmitting a light beam which is polarized in a particular direction. For example, glass or any other substance with no polarization property may be provided in the non-polarizing regions 1b and 2b or those regions 1b and 2b may even be filled with the air or any other environmental medium in which the exposure controller can be held, instead of being provided with any object. Still alternatively, the non-polarizing regions 1b and 2b may be provided with a polarizer or an ND filter that exhibits some polarization property other than the property of transmitting a light beam which is polarized in a particular direction.

Also, as long as Condition A and the conditions on θ and θ' are satisfied, the light quantity regulators 1 and 2 themselves do not have to have a circular shape, either.

Furthermore, even though the gear 4 and the light quantity regulators 1 and 2 are supposed to be rotated in this embodiment by rotating the gear 3, the arrangement, size and positions of the gears do not have to be the one described above. The number of the gears to provide may also be other than two. Optionally, the light quantity regulators 1 and 2 may even be directly driven by a motor.

That is to say, instead of rotating the light quantity regulators 1 and 2 by turning the gears 3 and 4, the axes of rotation 1c and 2c may be directly rotated. The light quantity regulators 1 and 2 do not have to be rotated as described for this embodiment but may also be rotated in any other way.

Moreover, the rotational velocity of the light quantity regulators 1 and 2 is not particularly limited but may be adjusted according to the number of revolutions of the driving source or the axle ratio of the gears. If necessary, the light quantity regulators 1 and 2 may have their velocity changed while rotating.

Optionally, while both of the polarizing regions 1a and 2a of the light quantity regulators 1 and 2 are overlapping with the optical path 5, one of the two light quantity regulators 1 and 2 may stop rotating.

The exposure controller of this embodiment may further include an additional optical element such as a wave plate to transform the incoming light into a circularly polarized light beam or a depolarizer on the light incoming side, separately from the light quantity regulators 1 and 2. By adopting such an arrangement, the influence of the subject dependence of the light quantity regulation, i.e., that the quantity of light regulated varies according to the polarization direction of the light that has come from the subject, can be reduced. Such an optical element may be arranged so that the light that has been transmitted through the light quantity regulators 1 and 2 is incident on the optical element.

Alternatively, the exposure controller of this embodiment may further include an additional optical element such as a wave plate to transform the linearly polarized light into a circularly polarized light beam or a depolarizer opposite from the light incoming side, separately from the light quantity regulators 1 and 2. By adopting such an arrangement, the light transmitted through the exposure controller 100 becomes a circularly polarized light beam. That is why even if such a light beam is incident on a device, of which the output is usually affected by polarization dependence, the influence of the polarization dependence can also be reduced. Examples of such devices, of which the output is usually affected by polarization dependence, include an AF system which is configured so that the light is split by an optical low-pass filter or a polarization prism and separately incident on an AF mechanism and an image sensor.

Furthermore, although the polarizing regions 1a and 2a of the light quantity regulators 1 and 2 are formed of a polarization film in the embodiment described above, the polarizing regions 1a and 2a may also be made of any other material as long as the material has a property of transmitting a light beam vibrating in a particular direction.

The exposure controller includes two light quantity regulators in the embodiment described above but may also include three or more light quantity regulators as well.

Optionally, the exposure controller of this embodiment may further include an optical diaphragm or a shutter. In that case, an image capture device which can shoot a subject under an appropriate shooting condition by changing the shutter speed, the depth of field and the exposure at the same time can be provided.

In this embodiment, if the gear 3 is further rotated from the position shown in FIG. 2(e) in the direction indicated by the arrow R, once a certain state has been passed, the same transmittance will be obtained, no matter in which direction the gear 3 is rotated, as long as the gear 3 is rotated to the same degree. That is why if the transmittance is changed from the minimum value into the maximum value and then changed into the minimum value again, there is no need to rotate the gear in the opposite direction but the gear may continue to be rotated in the same direction. Even so, the same effect can be achieved, too.

Figure 6:
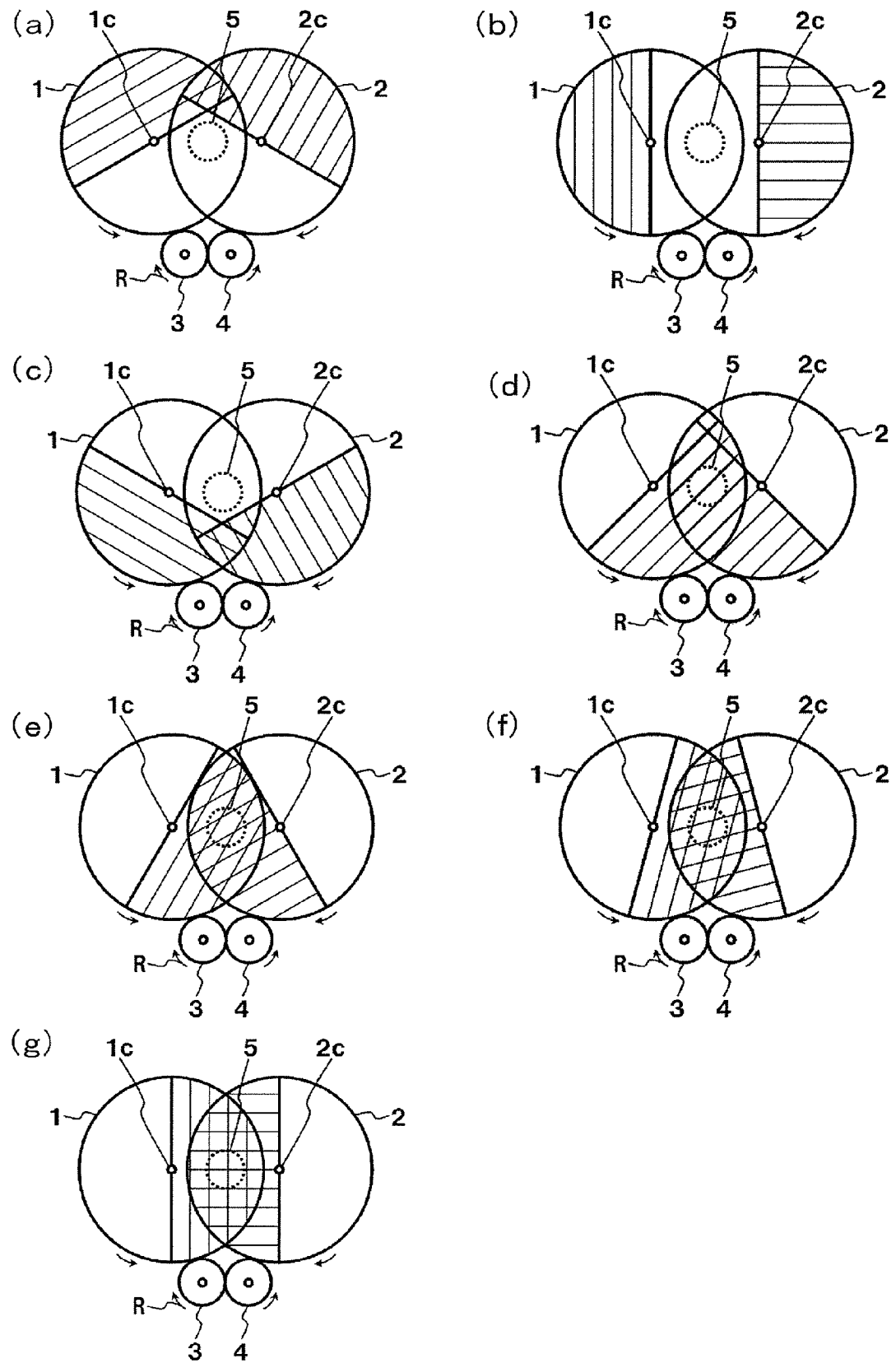
FIG. 6 (a) to (g) illustrate another series of states where light quantity regulators are rotated to respective degrees in the exposure controller of the first embodiment.

FIG. 6 illustrates how the gear 3 is further rotated from the position shown in FIG. 2(e) in the direction indicated by the arrow R.

FIG. 6(a) illustrates the same state as the one illustrated in FIG. 3(e) and shows that the light quantity regulator 1 has rotated 120 degrees from its position in the initial state in the direction opposite from the one indicated by the arrow R and the light quantity regulator 2 has rotated 120 degrees from its position in the initial state in the same direction as the one indicated by the arrow R. FIGS. 6(b), 6(c), 6(d), 6(e), 6(f) and 6(g) illustrate states where the regulators 1 and 2 have rotated 180, 240, 315, 330, 345 and 360 degrees, respectively, from their initial position in those two directions.

Hereinafter, it will be described with reference to FIGS. 2 and 6 how this exposure controller operates while comparing a situation where the gear 3 is rotated from its initial position shown in FIG. 6(b) in the same direction as the one indicated by the arrow R to a situation where the gear 3 is rotated from its initial position shown in FIG. 6(b) in the opposite direction from the one indicated by the arrow R.

If the gear 3 is rotated from its position shown in FIG. 6(b) in the opposite direction from the one indicated by the arrow R, the angles of rotation of the light quantity regulators 1 and 2 change as shown in FIG. 2(e) (or FIGS. 6(a)), 2(d), 2(c), 2(b) and 2(a) in this order. Likewise, if the gear 3 is rotated in the same direction as the one indicated by the arrow R, the angles of rotation of the light quantity regulators 1 and 2 change as shown in FIGS. 6(c), 6(d), 6(e), 6(f) and 6(g) in this order.

The absolute value of the angle of rotation of each of the light quantity regulators 1 and 2 (with respect to the state shown in FIG. 2(a)) is 60 degrees in FIGS. 2(e) and 6(c), 135 degrees in FIGS. 2(d) and 6(d), 150 degrees in FIGS. 2(c) and 6(e), 165 degrees in FIGS. 2(b) and 6(f), and 180 degrees in FIGS. 2(a) and 6(g). Furthermore, the same angle is formed between the axes of transmission of the respective polarizing regions 1a and 2a of the light quantity regulators 1 and 2, and therefore, the transmittance is also the same, in FIGS. 2(e) and 6(c), FIGS. 2(d) and 6(d), FIGS. 2(c) and 6(e), FIGS. 2(b) and 6(f), and in FIGS. 2(a) and 6(g). As can be seen from these results, supposing the state shown in FIG. 6(b) is an initial state, no matter whether the gear 3 is rotated in the same direction as, or in the opposite direction from, the one indicated by the arrow R, the transmittance remains the same as long as their angle of rotation is the same. Consequently, it can be seen that if the transmittance is changed from the minimum value into the maximum value and then changed into the minimum value again, or vice versa, there is no need to change the directions of rotation.

To achieve this feature that if the transmittance is changed from the minimum value into the maximum value and then changed into the minimum value again, or vice versa, there is no need to change the directions of rotation, the following conditions need to be satisfied:

In a situation where the optical path 5 has an axial symmetric shape which is symmetric with respect to a perpendicular bisector to the line segment that connects together the axes of rotation 1c and 2c and where the midpoint of the line segment that connects together the axes of rotation 1c and 2c agrees with the center of mass of the optical path 5, (1) the polarizing regions 1a and 2a should be arranged symmetrically with respect to that perpendicular bisector;

(2) if one of the polarizing regions 1a and 2a is turned over and if these two polarizing regions 1a and 2a are laid one upon the other, the directions of their axes of transmission should intersect with each other at right angles; and (3) Condition A described above and the conditions on θ and θ' are satisfied.

If these conditions are satisfied, the transmittance can be changed as described above irrespective of the shape of the polarizing regions 1a and 2a.

Embodiment 2

Figure 7:
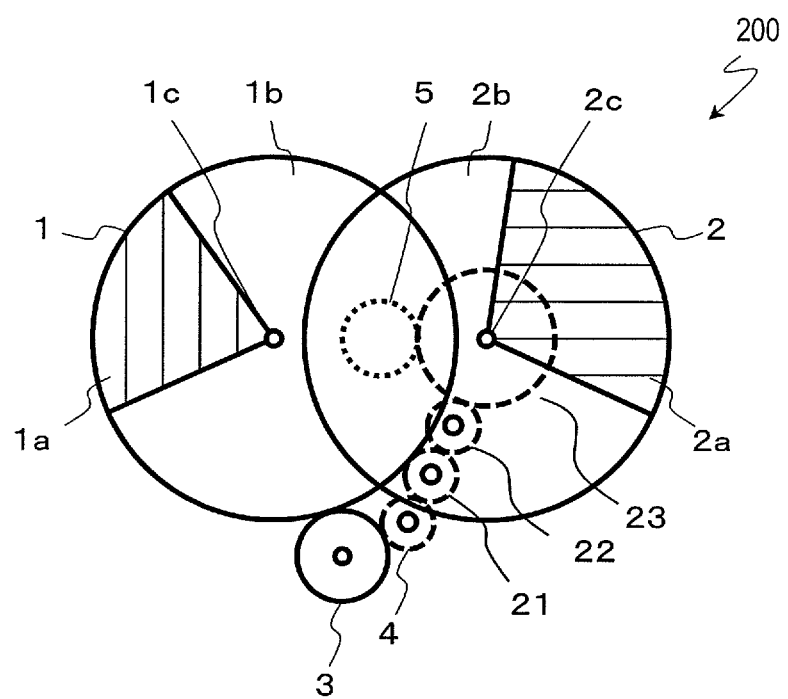
FIG. 7 Illustrates a configuration for a second embodiment of an exposure controller according to the present invention.

FIG. 7 illustrates a configuration for a second embodiment of an exposure controller according to the present invention.

The exposure controller 200 shown in FIG. 7 includes light quantity regulators 1 and 2 and gears 3, 4, 21, 22 and 23. This exposure controller 200 has the same basic configuration as the exposure controller 100, and will be described using the same reference numerals. In the exposure controller 200, however, the light quantity regulators 1 and 2 rotate at mutually different velocities, which is a major difference from the exposure controller 100 of the first embodiment.

As in the exposure controller 100 described above, each of these two light quantity regulators 1 and 2 has a polarizing region 1a, 2a that has a property of transmitting a light beam vibrating in a particular direction and a non-polarizing region 1b, 2b that does not have such a property of transmitting a light beam vibrating in the particular direction. Also, the light quantity regulators 1 and 2 have axes of rotation 1c and 2c, respectively. These axes of rotation 1c and 2c are located inside of the light quantity regulators 1 and 2 and outside of the optical path 5. These light quantity regulators 1 and 2 partially overlap with each other on the optical path and cross the optical path 5 entirely. The incoming light (not shown) does not always have to be incident perpendicularly, but may also be incident obliquely, onto the light quantity regulators 1 and 2.

The polarizing regions 1a and 2a may be formed of a polarization film, for example. The non-polarizing regions 1b and 2b do not have the property of transmitting a light beam polarized in a particular direction. As in the first embodiment described above, the striped pattern drawn on the light quantity regulators 1 and 2 indicates the polarizing regions 1a and 2a and the direction in which the stripes run indicates the direction in which the transmitted light vibrates.

The gear 3 rotates with the power supplied by a motor that is a driving source (not shown). As the gear 3 rotates, the light quantity regulator 1 and the gear 4 which are engaged with the gear 3 also rotate. And as the gear 4 rotates, the gear 4 soon gets engaged with the other gears 21, 22 and 23 sequentially in this order, thereby rotating the gear 23 in the same direction as the gear 4.

The gear 23 rotates on the same axis of rotation 2c as the light quantity regulator 2. Since the light quantity regulator 2 and the gear 23 are fixed to the axis of rotation 2c, as the gear 23 rotates, the light quantity regulator 2 also rotates in the same direction and at the same rotational velocity. The number of teeth of the gear 23 is a half as large as the number of teeth of the gear provided on the side surface of the light quantity regulator 1. It should be noted that in FIG. 7, the radius of the gear 23 is not to scale. That is why while the light quantity regulator 1 makes one turn, the light quantity regulator 2 makes two turns in the opposite direction. With such a structure adopted, the light quantity regulators 1 and 2 rotate at mutually different velocities. In this embodiment, the light quantity regulators 1 and 2 rotate at a velocity ratio of one to two. Hereinafter, it will be described with reference to FIG. 8 how this exposure controller 200 operates. On the drawings to be referred to in the following description, the gears 21, 22 and 23 are not shown for the sake of simplicity.

Figure 8:
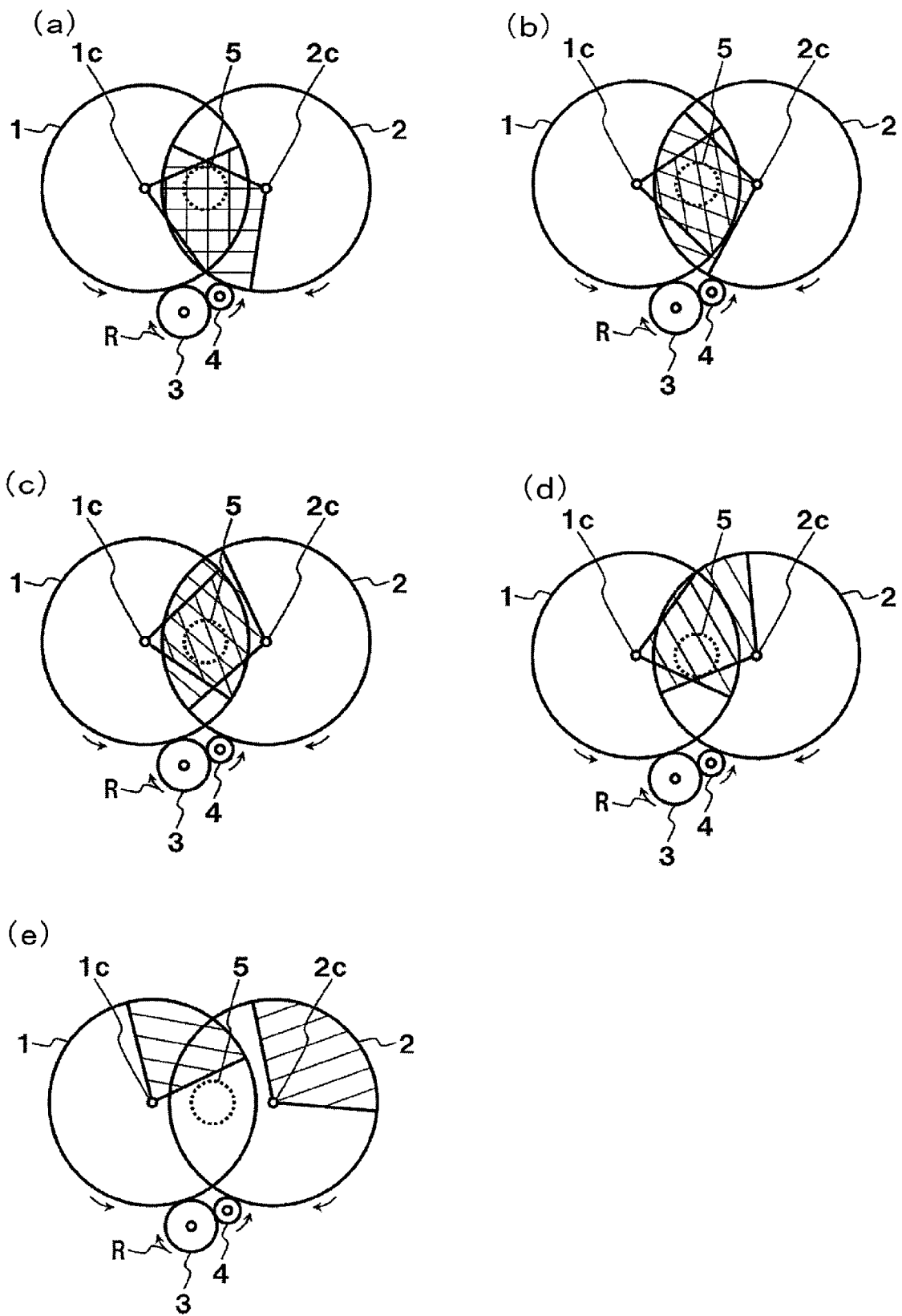
FIG. 8 (a) to (e) illustrate a series of states where light quantity regulators are rotated to respective degrees in the exposure controller of the second embodiment.

FIG. 8 illustrate how the light quantity regulators 1 and 2 rotate as the gear 3 is turned in the direction indicated by the arrow R supposing in an initial state, the respective axes of transmission of the polarizing regions 1a and 2a of the light quantity regulators 1 and 2 intersect with each other at right angles and the respective polarizing regions 1a and 2a of the light quantity regulators 1 and 2 cover the optical path 5 entirely.

FIG. 8(a) illustrates the initial state. FIG. 8(b) illustrates a state where the light quantity regulators 1 and 2 have rotated 10 and 20 degrees from their initial positions in the opposite direction from the one indicated by the arrow R and in the same direction as the one indicated by the arrow R, respectively. FIG. 8(c) illustrates a state where the light quantity regulators 1 and 2 have rotated 20 and 40 degrees from their initial positions in the opposite direction from the one indicated by the arrow R and in the same direction as the one indicated by the arrow R, respectively. FIG. 8(d) illustrates a state where the light quantity regulators 1 and 2 have rotated 30 and 60 degrees from their initial positions in the opposite direction from the one indicated by the arrow R and in the same direction as the one indicated by the arrow R, respectively. And FIG. 8(e) illustrates a state where the light quantity regulators 1 and 2 have rotated 80 and 160 degrees from their initial positions in the opposite direction from the one indicated by the arrow R and in the same direction as the one indicated by the arrow R, respectively.

As shown in FIG. 8(a), in the initial state, the axes of transmission of the respective polarizing regions 1a and 2a of the light quantity regulators 1 and 2 intersect with each other at right angles, and therefore, the transmittance of this exposure controller 200 becomes the smallest. As shown in FIGS. 8(a) to 8(d), as the gear 3 rotates, the light quantity regulators 1 and 2 also rotate and the transmittance of this exposure controller 200 increases. And when the axes of transmission of the respective polarizing regions 1a and 2a of the light quantity regulators 1 and 2 become parallel to each other as shown in FIG. 8(d), the transmittance becomes maximum while the respective polarizing regions 1a and 2a of the light quantity regulators 1 and 2 lie one upon the other on the optical path 5. If the light quantity regulators 1 and 2 are further rotated from their positions shown in FIG. 8(d) by rotating the gear 3, the state shown in FIG. 8(e) will soon be reached. Then, all of the incoming light will be incident on the non-polarizing regions 1b and 2b and transmitted completely through this exposure controller 200 without being cut. Also, if the gear 3 is rotated from the position shown in FIG. 8(e) in the direction opposite from the one indicated by the arrow R, then the states can be changed sequentially in reverse order from the ones shown in FIG. 8(e) to the initial state shown in FIG. 8(a).

The exposure controllers 100 and 200 have the same transmittance in the states shown in FIGS. 2(a) and 8(a), in the states shown in FIGS. 2(b) and 8(b), in the states shown in FIGS. 2(c) and 8(c), in the states shown in FIGS. 2(d) and 8(d), and in the states shown in FIGS. 2(e) and 8(e).

As can be seen, according to this embodiment, the friction between the polarizers and other members can be reduced, and a state where there are no polarizers at all on the optical path can be created, by using a simple structure. As a result, an exposure controller which can change the transmittance precisely in a broad range is realized. On top of that, by rotating the light quantity regulators 1 and 2 at mutually different velocities, the transmittance can be controlled in a broader range.

In the embodiment described above, the ratio of the rotational velocities of the light quantity regulators 1 and 2 is supposed to be one to two. However, as long as Condition A and the conditions on θ and θ' are satisfied, the velocity ratio may be changed arbitrarily. Also, if necessary, the velocity ratio could be changed while they are rotating. The rotational velocity is not particularly limited but may be adjusted according to the number of revolutions of the driving source or the axle ratio of the gears. If necessary, the velocity could be changed while they are rotating. Furthermore, while both of the polarizing regions 1a and 2a of the light quantity regulators 1 and 2 cover the optical path 5 entirely, one of the light quantity regulators 1 and 2 may be standing still.

Also, in FIGS. 7 and 8, the polarizing regions 1a, 2a and the non-polarizing regions 1b, 2b are illustrated as having a fan shape, of which the radius is approximately twice as large as the diameter of the optical path 5. However, as long as Condition A and the conditions on θ and θ' are satisfied, the sizes and shapes of the polarizing regions 1a, 2a and the non-polarizing regions 1b, 2b may be changed arbitrarily.

Furthermore, those variations and modified examples that have been described for the first embodiment are also applicable to this exposure controller 200, too.

Embodiment 3

Figure 9A:
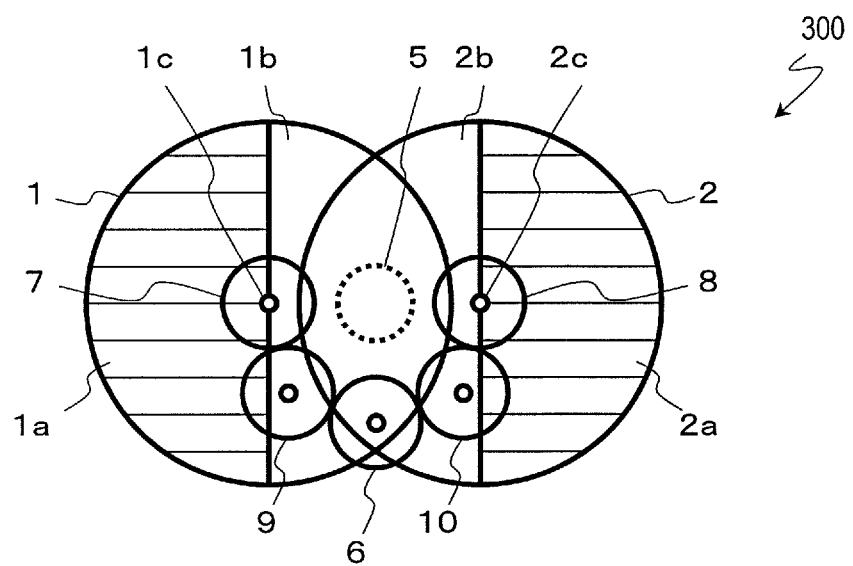
FIG. 9A A top view illustrating a configuration for a third embodiment of an exposure controller according to the present invention.

FIG. 9A illustrates a configuration for a third embodiment of an exposure controller according to the present invention.

In the exposure controller 300 shown in FIG. 9A, its gears have a different arrangement and its light quantity regulators rotate in different directions from their counterparts of the exposure controller 100 of the first embodiment.

This exposure controller 300 includes light quantity regulators 1 and 2 and gears 6, 7, 8, 9 and 10. Each of these two light quantity regulators 1 and 2 has a polarizing region 1a, 2a that has a property of transmitting a light beam vibrating in a particular direction and a non-polarizing region 1b, 2b that does not have such a property of transmitting a light beam vibrating in the particular direction. Also, the light quantity regulators 1 and 2 have axes of rotation 1c and 2c, respectively. These axes of rotation 1c and 2c are located inside of the light quantity regulators 1 and 2 and outside of the optical path 5. These light quantity regulators 1 and 2 partially overlap with each other on the optical path and cross the optical path 5 entirely. The incoming light (not shown) does not always have to be incident perpendicularly, but may also be incident obliquely, onto the light quantity regulators 1 and 2.

The polarizing regions 1a and 2a may be formed of a polarization film, for example. The non-polarizing regions 1b and 2b do not have the property of transmitting a light beam polarized in a particular direction. As in the first embodiment described above, the striped pattern drawn on the light quantity regulators 1 and 2 indicates the polarizing regions 1a and 2a and the direction in which the stripes run indicates the direction in which the transmitted light vibrates.

Figure 9B:
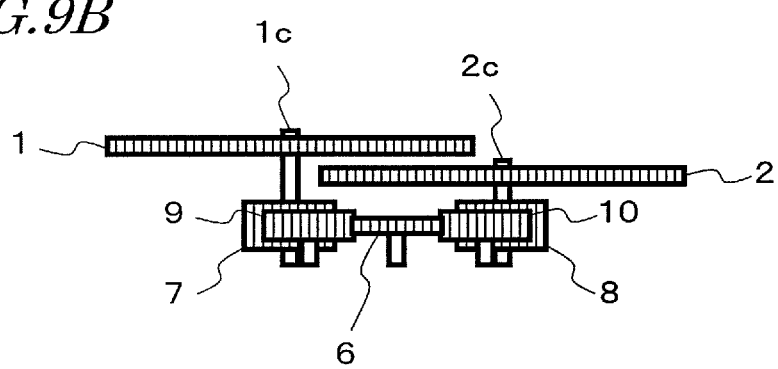
FIG. 9B A side view of the exposure controller of the third embodiment.

FIG. 9B is a side view of the exposure controller 300 shown in FIG. 9A. If their thicknesses are ignored, those gears 6, 7, 8, 9 and 10 are located on the same plane.

The gear 6 rotates with the power supplied by a motor that is a driving source (not shown). The gear 6 is engaged with the gears 9 and 10 at an axle ratio of one to one. Likewise, the gears 9 and 7 and the gears 8 and 10 are engaged with each other at an axle ratio of one to one, too. That is why as the gear 6 rotates, the gears 7 and 8 also rotate at the same velocity and in the same direction.

The light quantity regulator 1 and the gear 7 are fixed to the axis of rotation 1c. That is why as the gear 7 is turned, the axis of rotation 1c rotates to make the light quantity regulator 1 rotate, too. Likewise, the light quantity regulator 2 and the gear 8 are fixed to the axis of rotation 2c. And as the gear 8 is turned, the axis of rotation 2c rotates to make the light quantity regulator 2 rotate, too. That is to say, by turning the gear 6, the light quantity regulators 1 and 2 rotate at the same velocity and in the same direction. Also, the gear 9 is an intermittent gear and controls the stop and rotation of the gear 7. That is why the gear 9 may also control the sop and rotation of the light quantity regulator 1.

Figure 10:
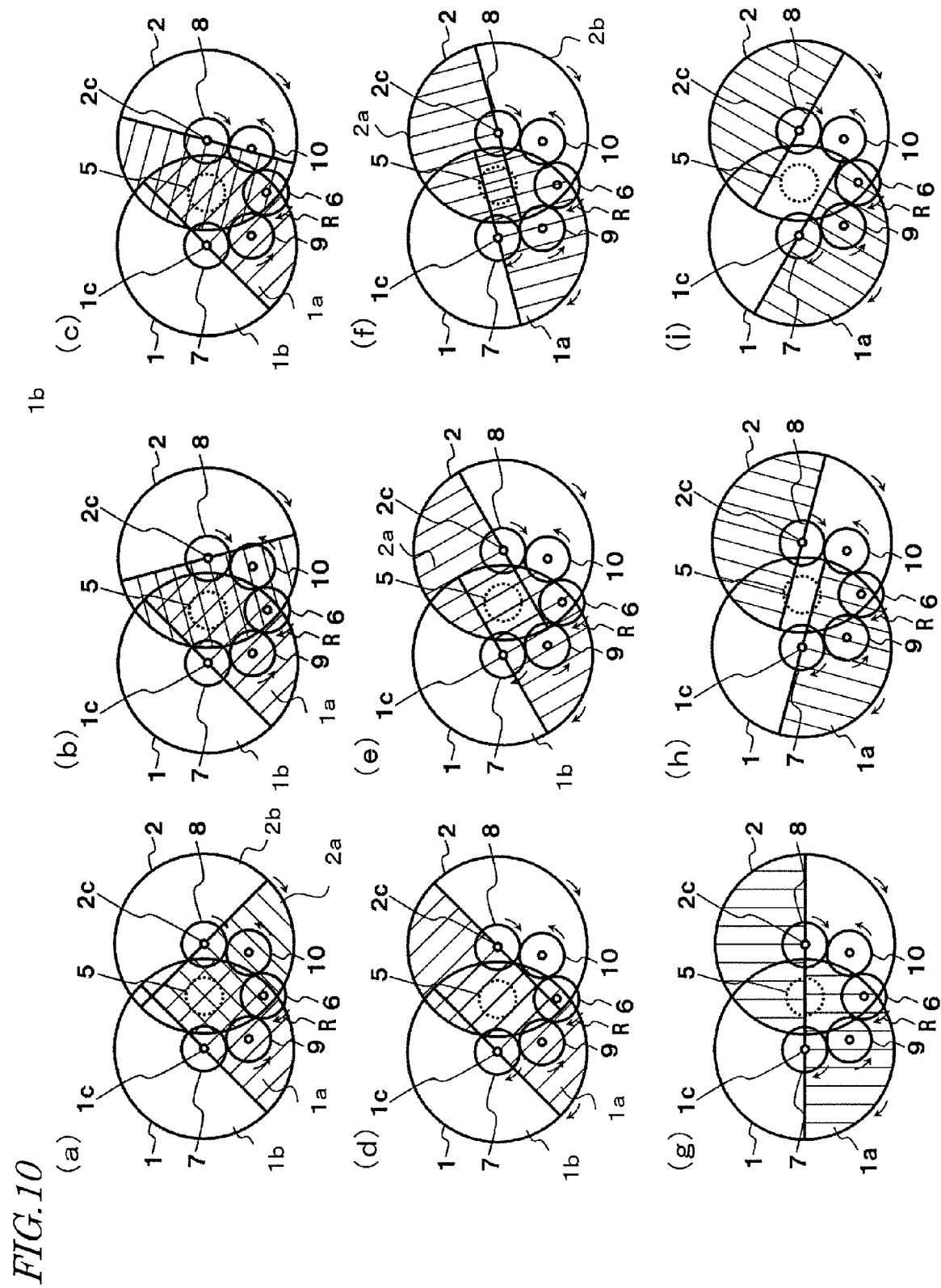
FIG. 10 (a) to (i) illustrate a series of states where light quantity regulators are rotated to respective degrees in the exposure controller of the third embodiment.

FIG. 10 illustrates how the light quantity regulators 1 and 2 rotate as the gear 6 is turned in the direction indicated by the arrow R supposing in an initial state, the respective axes of transmission of the polarizing regions 1a and 2a of the light quantity regulators 1 and 2 intersect with each other at right angles and the respective polarizing regions 1a and 2a of the light quantity regulators 1 and 2 cover the optical path 5 entirely.

FIG. 10(a) illustrates the initial state of the light quantity regulators 1 and 2. From the state shown in FIG. 10(a) through the state shown in FIG. 10(d), the intermittent gear 9 is not engaged with the gear 7 yet, and therefore, the gear 7 and the light quantity regulator 1 are standing still. That is why during this series of states shown in FIGS. 10(a) through 10(d), only the light quantity regulator 2 rotates. FIG. 10(b) illustrates a state where the light quantity regulator 2 has rotated 30 degrees from its initial position in the same direction as the one indicated by the arrow R. FIG. 10(c) illustrates a state where the light quantity regulator 2 has rotated 60 degrees from its initial position in the same direction as the one indicated by the arrow R. And FIG. 10(d) illustrates a state where the light quantity regulator 2 has rotated 90 degrees from its initial position in the same direction as the one indicated by the arrow R.

When the state shown in FIG. 10(*d*) is reached, the intermittent gear 9 gets engaged with the gear 7 to make the gear 7 start to rotate. That is why with the axes of transmission of the respective polarizing regions 1*a* and 2*a* of the light quantity regulators 1 and 2 kept parallel to each other, the light quantity regulator 1 rotates at the same velocity and in the same direction as the light quantity regulator 2. FIG. 10(*e*) illustrates a state where the light quantity regulators 1 and 2 have rotated 15 and 105 degrees, respectively, from their initial positions in the same direction as the one indicated by the arrow R. FIG. 10(*f*) illustrates a state where the light quantity regulators 1 and 2 have rotated 30 and 120 degrees, respectively, from their initial positions in the same direction as the one indicated by the arrow R. FIG. 10(*g*) illustrates a state where the light quantity regulators 1 and 2 have rotated 45 and 135 degrees, respectively, from their initial positions in the same direction as the one indicated by the arrow R. FIG. 10(*h*) illustrates a state where the light quantity regulators 1 and 2 have rotated 60 and 150 degrees, respectively, from their initial positions in the same direction as the one indicated by the arrow R. And FIG. 10(*i*) illustrates a state where the light quantity regulators 1 and 2 have rotated 75 and 165 degrees, respectively, from their initial positions in the same direction as the one indicated by the arrow R.

Figure 11:
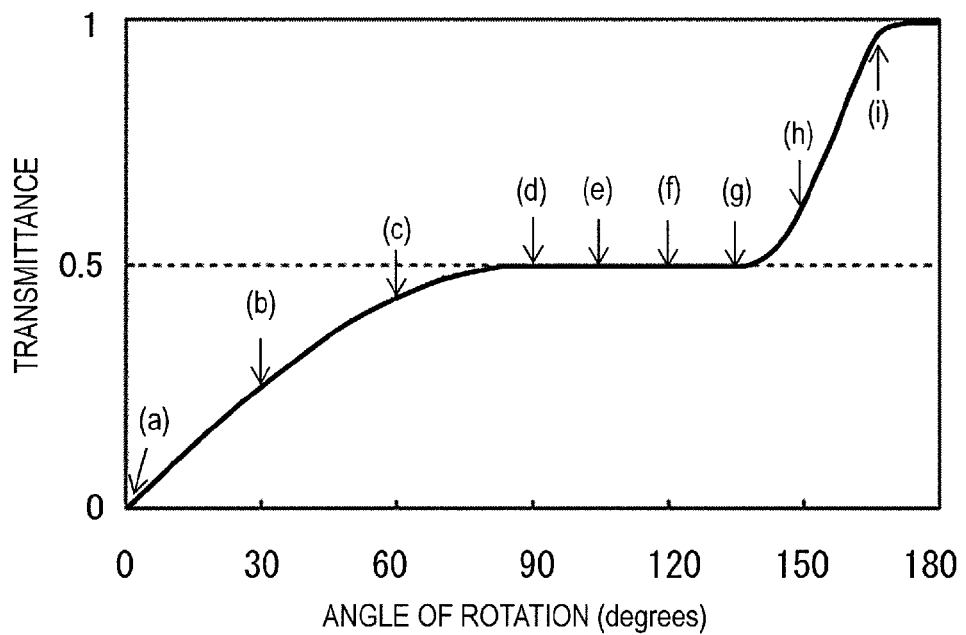
FIG. 11 A graph showing how the transmittance of the exposure controller of the third embodiment changes with the angle of rotation of its light quantity regulators.

FIG. 11 shows how the transmittance of the exposure controller 300 changes with the angle of rotation of the light quantity regulator 2 from its initial position. It should be noted that the relation between the angle of rotation and the transmittance is shown in FIG. 11 just schematically and not exactly, and therefore, is not intended to limit the scope of the present invention. In FIG. 11, the reference signs (a) through (i) indicate that the angles of rotation of the light quantity regulator 2 are as shown in FIGS. 10(*a*) through 10(*i*), respectively.

As shown in FIG. 10(*a*), in the initial state, the axes of transmission of the respective polarizing regions 1*a* and 2*a* of the light quantity regulators 1 and 2 intersect with each other at right angles, and therefore, the transmittance of this exposure controller 300 becomes the smallest. That is to say, in such a state, the transmittance is lower than 50%, e.g., 0%.

Next, as shown in FIGS. 10(*a*) through 10(*d*), as the light quantity regulator 2 is rotated by turning the gear 6, the transmittance of the exposure controller 300 increases as shown in FIG. 11. And when the axes of transmission of the respective polarizing regions 1*a* and 2*a* of the light quantity regulators 1 and 2 become parallel to each other as shown in FIG. 10(*d*), the transmittance becomes maximum while the respective polarizing regions 1*a* and 2*a* of the light quantity regulators 1 and 2 are present on the optical path 5. In such a situation, the transmittance may be approximately 50%, for example.

When the state shown in FIG. 10(*d*) is reached, the intermittent gear 9 gets engaged with the gear 7. As a result, by turning the gear 6, the light quantity regulators 1 and 2 rotate at the same rotational velocity and in the same direction as shown in FIGS. 10(*d*) to 10(*g*). Consequently, the light quantity regulators 1 and 2 rotate in the same direction with the respective axes of transmission of their polarizing regions 1*a* and 2*a* kept parallel to each other. In this case, the area of overlap between these polarizing regions 1*a* and 2*a* on the optical path 5 decreases gradually. However, since their axes of transmission are kept parallel to each other, the quantity of light transmitted through the light quantity regulators 1 and 2 does not change and is constant from the state shown in FIG. 10(*d*) through the state shown in FIG. 10(*g*) as shown in FIG. 11.

As the light quantity regulators 1 and 2 further rotate from their positions shown in FIG. 10(*g*), the respective non-polarizing regions 1*b* and 2*b* start to overlap with the optical path 5 as shown in FIG. 10(*h*). That is why the quantity of light that is not cut by the light quantity regulators 1 and 2 starts to increase and the transmittance increases gradually as shown in FIG. 11.

And when the state shown in FIG. 10(*i*) is reached, the optical path 5 is completely covered with the non-polarizing regions 1*b* and 2*b*. As a result, all of the light that has entered this exposure controller 300 can be transmitted completely without being cut. In such a situation, the transmittance may be approximately 100%, for example.

If the gear 3 is rotated from the position shown in FIG. 10(*e*) in the direction opposite from the one indicated by the arrow R, then the states can be changed sequentially in reverse order from the one shown in FIG. 10(*e*) to the initial state shown in FIG. 10(*a*).

Consequently, according to this embodiment, the light quantity regulators 1 and 2 can be rotated as shown in FIGS. 10(*a*) through 10(*i*) using a single driving source, and therefore, the transmittance of the exposure controller 300 can be increased or decreased monotonically. In addition, according to such a configuration, even if the light quantity regulators 1 and 2 are rotated in the same direction, a state where there are no polarizers at all on the optical path can be created without increasing the friction between the polarizers and other members, and the exposure can be controlled highly precisely.

According to the first and second embodiments described above, the transmittance increases monotonically from the state shown in FIG. 2(*a*) through the state shown in FIG. 2(*d*) but the transmittance becomes lower than in the state shown in FIG. 3(*d*) while the state changes from the one shown in FIG. 2(*d*) into the one shown in FIG. 3(*e*). That is to say, sometimes, the quantity of light may change non-monotonically from the minimum value to the maximum value. On the other hand, according to this embodiment, the transmittance of the exposure controller 300 can be changed monotonically from the minimum value to the maximum value. Consequently, the intended transmittance can be achieved easily or the quantity of light transmitted through the optical path can be regulated easily.

Also, in the exposure controller 100 of the first embodiment, while the non-polarizing regions 1*b* and 2*b* are going to overlap with the optical path 5 (i.e., in the transitional state between the ones shown in FIGS. 2(*d*) and 2(*e*)), the respective axes of transmission of the polarizing regions 1*a* and 2*a* continue to be not parallel to each other. That is to say, in that transitional state, the transmittance is lower than approximately 50% in some regions of the optical path 5 but is approximately 100% in other regions thereof. That is why significant diffraction of light may be observed on the boundary between those two kinds of regions.

On the other hand, in this exposure controller 300, the non-polarizing regions 1*b* and 2*b* of the light quantity regulators 1 and 2 gradually overlap with the optical path 5 with the axes, of transmission of the respective polarizing regions 1*a* and 2*a* of the light quantity regulators 1 and 2 kept parallel to each other. That is to say, such a state where the transmittance is approximately 50% in some regions of the optical path 5 and approximately 100% in other regions thereof lasts and the influence of the diffraction of light can be minimized.

In this embodiment, the rotational velocity of the light quantity regulators 1 and 2 is not particularly limited but may be adjusted according to the number of revolutions of the driving source or the axle ratio of the gears. If necessary, the light quantity regulators 1 and 2 may have their velocity changed while rotating. Also, the light quantity regulator 1 does not have to stand still.

Figure 12:
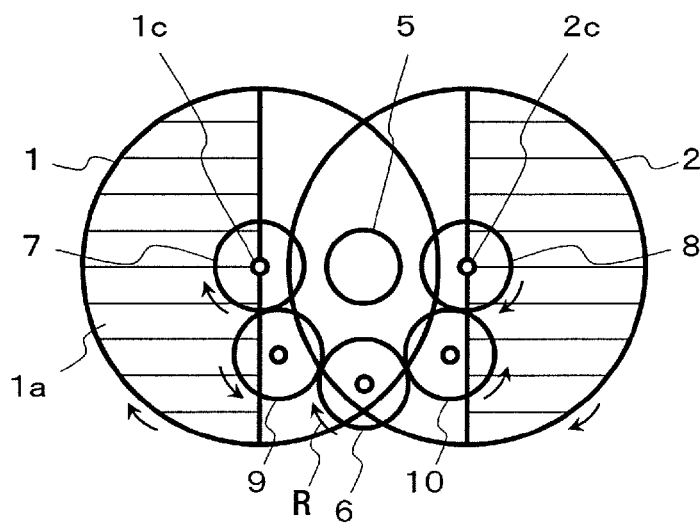
FIG. 12 Illustrates an arrangement of two light quantity regulators in the exposure controller of the third embodiment.

Optionally, only the axle ratio may be changed without keeping the light quantity regulators 1 and 2 from rotating at the same velocity. Specifically, each of the two pairs of gears 7, 9 and 8, 10 may have an axle ratio of four to five. Also, as the intermittent gear 7, a gear having no teeth in two-fifths of its circumference may be used. Furthermore, suppose the point of contact between the gears 7 and 9 agrees with an intermediate point between some teeth of the gear 7 while the axes of transmission of the respective polarizing regions 1*a* and 2*a* of the light quantity regulators 1 and 2 intersect with each other at right angles as shown in FIG. 10(*a*). In such a situation, if the gear 6 is further rotated from the position shown in FIG. 11(*i*) in the direction indicated by the arrow R and once the state shown in FIG. 12 is reached, the same transmittance will be obtained, no matter in which direction the gear 6 is rotated from that intermediate point, as long as the angle of rotation is the same. Consequently, as in the second embodiment described above, if the transmittance is changed from the minimum value into the maximum value and then changed into the minimum value again, or vice versa, there is no need to rotate the gear in the opposite direction and the same effect can be achieved even if the gear continues to be rotated in the same direction. That is to say, there is no need to change the directions of rotation.

To achieve this feature that if the transmittance is changed from the minimum value into the maximum value and then changed into the minimum value again, or vice versa, there is no need to change the directions of rotation, the following conditions need to be satisfied. Specifically, in a situation where the optical path 5 has an axial symmetric shape which is symmetric with respect to a perpendicular bisector to the line segment that connects together the axes of rotation 1*c* and 2*c* and where the midpoint of the line segment that connects together the axes of rotation 1*c* and 2*c* agrees with the center of mass of the optical path 5, (1) the polarizing regions 1*a* and 2*a* should be arranged symmetrically with respect to that perpendicular bisector;
(2) if one of the polarizing regions 1*a* and 2*a* is turned over and if these two polarizing regions 1*a* and 2*a* are laid one upon the other, the directions of their axes of transmission should intersect with each other at right angles; and
(3) Condition A described above and the conditions on θ and θ' are satisfied.

If these conditions are satisfied, the transmittance can be changed as described above irrespective of the shape of the polarizing regions 1*a* and 2*a*. Those variations and modified examples that have been described for the first embodiment are also applicable to this exposure controller 300, too.

Embodiment 4

Figure 13:
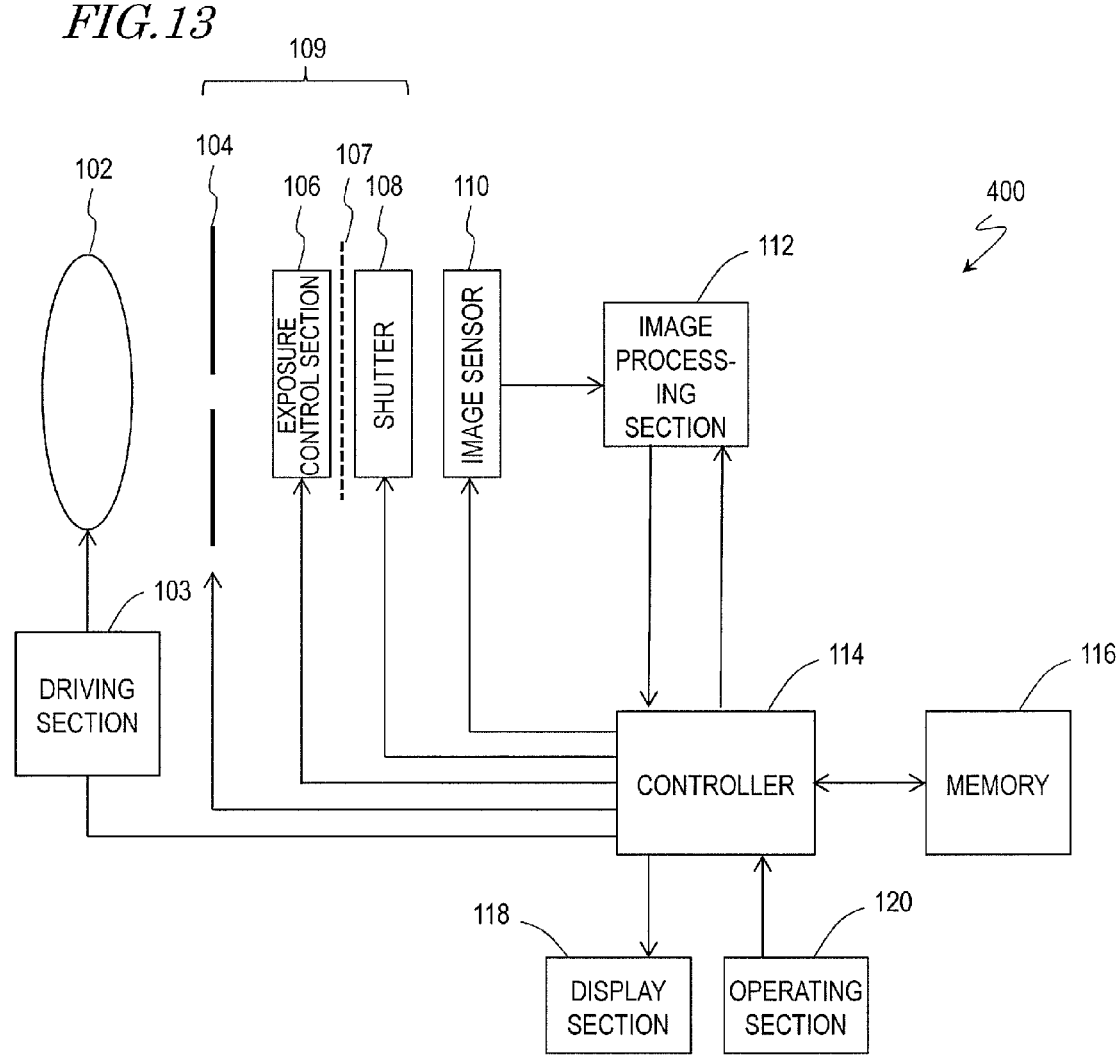
FIG. 13 A block diagram illustrating an embodiment of an image capture device according to the present invention.

FIG. 13 is a schematic block diagram illustrating an embodiment of an image capture device according to the present invention. The image capture device 400 shown in FIG. 13 includes an optical system 102, an exposure controller 109, an image sensor 110, and an image processing section 112.

The optical system 102 includes a focus lens and produces an image of a subject to shoot on the image capturing plane of the image sensor 110. Although the optical system 102 is illustrated as a single lens in FIG. 13, the optical system 102 may be comprised of a plurality of lenses and may further include a zoom lens and other optical elements. To adjust the positions of the focus lens and zoom lens, the image capture device 400 may further include a driving section 103.

The exposure controller 109 regulates the quantity of the light that has been transmitted through the optical system 102, and is arranged between the optical system 102 and the image sensor 110. In this embodiment, the exposure controller 109 includes an optical diaphragm 104, an exposure control section 106 and a shutter 108. As the exposure control section 106, an exposure controller according to any of the first through third embodiments described above may be used. Even though the exposure control section 106 is arranged in this embodiment between the optical diaphragm 104 and the shutter 108, such an arrangement does not have to be adopted. Alternatively, the exposure control section 106 may also be arranged between the shutter 108 and the image sensor 110 or at any other suitable position. Optionally, the optical diaphragm 104 and the shutter 108 may be integrated together. And the shutter 108 may be any of mechanical and electronic ones. If only an electronic shutter is used, the electronic shutter may be provided for the image sensor 110. Also, if the optical system 102 includes two or more lenses as described above, the optical diaphragm 104 and some of the components of the exposure controller 109 may be arranged between any two adjacent ones of the multiple lenses of the optical system 102.

As already described for the first embodiment, the exposure controller 109 may further include an optical element 107 which transforms a linearly polarized light beam into a circularly polarized light beam. The optical element 107 may be arranged between the exposure control section 106 and the shutter 108 so that the light transmitted through the exposure control section 106 is incident on the optical element 107. Or the light transmitted through the optical element 107 may be incident on the exposure control section 106.

The image sensor 110 senses the subject image produced on the image plane and converts the image into an electrical signal, thereby generating image data.

The image capture device 400 further includes a controller 114, a memory 116, a display section 118 and an operating section 120. The controller 114 receives the image data from the image processing section 112 and writes it on the memory 116. The image data received from the image processing section 112 or the image data retrieved from the memory 116 is output to the display section 118. Also, the controller 114 accepts a user's instruction via the operating section 120 and controls the respective sections of this image capture device 400.

This image capture device 400 includes the exposure control section 106 that regulates the quantity of light to be incident on the image sensor 110, separately from the optical diaphragm 104 and the shutter 108. That is why even if the scene to shoot is too bright, the quantity of light to be incident on the image sensor 110 can be reduced by the exposure control section 106 without decreasing the aperture of the optical diaphragm. As a result, a sharp image can be obtained without causing a small aperture blur.

In addition, the exposure value can be regulated independently of the depth of field to be determined by the aperture size of the optical diaphragm 104 and the exposure time (shutter speed) to be controlled by the shutter 110. Consequently, an image can be captured at an appropriate exposure value with the depth of field and the blur of the subject maintained at the levels that have been set by the user.

INDUSTRIAL APPLICABILITY

An exposure controller according to the present disclosure is applicable to cameras, movies and any other image capture device in general and to an optical filter for regulating the quantity of light, for example.

REFERENCE SIGNS LIST

100, 101, 200, 300 exposure controller
1, 2 light quantity regulator
1a, 2a polarizing region
1b, 2b non-polarizing region
1c, 2c axis of rotation
3, 4, 6, 7, 8, 9, 10 gear
5 optical path
1000 conventional exposure controller
1001, 1002 polarizer
1003 polarizer driving plate

The invention claimed is:

1. An exposure controller to be arranged on an optical path, the controller comprising:
    first and second light quantity regulators, each of which has a first region that has a property of transmitting a light beam polarized in a particular direction and a second region that does not have the property of transmitting a light beam polarized in the particular direction, and
    a rotating mechanism which regulates the quantity of light by rotating the first and second light quantity regulators, the rotating mechanism being switched between a state where rotating velocities of the first and second light quantity regulators are not equal and a state where rotating velocities of the first and second light quantity regulators are equal.

2. The exposure controller of claim 1, wherein each of the first and second light quantity regulators has an axis of rotation at their center, and
    the axes of rotation are arranged outside of the optical path, and
    the first and second light quantity regulators partially overlap with each other on the optical path, and
    the quantity of light is regulated by having the first and second light quantity regulators rotate on their axis of rotation.

3. The exposure controller of claim 2, wherein the respective axes of rotation of the first and second light quantity regulators are arranged at mutually different positions.

4. The exposure controller of claim 2, wherein if the first and second light quantity regulators have rotated so that the respective first regions of the first and second light quantity regulators overlap with the optical path and that those particular directions in the respective first regions of the first and second light quantity regulators are perpendicular to each other, the transmittance of light through the first and second light quantity regulators becomes minimum.

5. The exposure controller of claim 2, wherein if the first and second light quantity regulators have rotated so that the respective second regions of the first and second light quantity regulators overlap with the optical path, the transmittance of light through the first and second light quantity regulators becomes maximum.

6. The exposure controller of claim 2, wherein while the respective first regions of the first and second light quantity regulators are overlapping with the optical path, those particular directions in the respective first regions of the first and second light quantity regulators which have been perpendicular to each other become parallel to each other.

7. The exposure controller of claim 2, wherein while those particular directions in the respective first regions of the first and second light quantity regulators are parallel to each other, the first and second light quantity regulators rotate in the same direction at the same velocity,
    wherein while the respective first regions of the first and second light quantity regulators are overlapping with the optical path and while those particular directions in the respective first regions of the first and second light quantity regulators are not parallel to each other, one of the first and second light quantity regulators is rotating but the other is standing still.

8. The exposure controller of claim 1, wherein the first and second light quantity regulators rotate in mutually opposite directions at the same velocity.

9. The exposure controller of claim 1, wherein the first and second light quantity regulators rotate in mutually opposite directions at respectively different velocities.

10. The exposure controller of claim 1, wherein the first and second light quantity regulators rotate in the same direction at respectively different velocities.

11. The exposure controller of claim 1, wherein the respective axes of rotation of the first and second light quantity regulators are aligned with each other.

12. The exposure controller of claim 1, further comprising an optical element which transforms incoming light into a circularly polarized light beam,
    wherein the light that has been transmitted through the optical element is transmitted through the first and second light quantity regulators.

13. The exposure controller of claim 1, further comprising an optical element which is arranged so that light that has been transmitted through the first and second light quantity regulators is incident on the optical element and which transforms the incident light into a circularly polarized light beam.

14. The exposure controller of claim 1, further comprising an optical diaphragm or shutter to be arranged on the optical path of the optical system.

15. The exposure controller of claim 1, wherein the rotating mechanism is switched from a first state where one of the first and second light quantity regulators rotates and the other of the first and second light quantity regulators is stopped, to a second state where both of the first and second light quantity regulators rotate at the same rotating velocities.

16. The exposure control device of claim 15, wherein in the first state a polarization axis of transmission of the first light quantity regulator is brought into being parallel with a polarization axis of transmission of the second light quantity regulator, and in the second state the axes of polarization of the first and second light quantity regulators are maintained parallel to each other.

17. The exposure control device of claim 16, wherein in a third state the first and second light quantity regulators are moved to where the second regions that do not have the property of transmitting a light beam polarized in the particular direction cover the optical path.

18. The exposure controller of claim 15, wherein the light quantity increases gradually in the first state where one of the first and second light quantity regulators rotates and the other of the first and second light quantity regulators is stopped.

19. The exposure controller of claim 1, wherein the light quantity increases gradually in the state where rotating velocities of the first and second light quantity regulators are not equal.

* * * * *